(12) United States Patent
Co et al.

(10) Patent No.: US 7,474,576 B2
(45) Date of Patent: Jan. 6, 2009

(54) REPAIRING ADVANCED-MEMORY BUFFER (AMB) WITH REDUNDANT MEMORY BUFFER FOR REPAIRING DRAM ON A FULLY-BUFFERED MEMORY-MODULE

(75) Inventors: Ramon S. Co, Trabuco Canyon, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 0 days.

(21) Appl. No.: 12/053,261

(22) Filed: Mar. 21, 2008

(65) Prior Publication Data

US 2008/0165600 A1 Jul. 10, 2008

Related U.S. Application Data

(62) Division of application No. 11/309,297, filed on Jul. 24, 2006, now Pat. No. 7,379,361.

(51) Int. Cl.
*G11C 29/00* (2006.01)
(52) U.S. Cl. .............. 365/201; 365/185.22; 365/230.08
(58) Field of Classification Search ................. 365/201, 365/230.08, 185.22, 189.05, 191, 198, 51, 365/63, 185.09
See application file for complete search history.

(56) References Cited

U.S. PATENT DOCUMENTS 7,386,656 B2 * 6/2008 Rajan et al. ................. 711/103
2007/0136537 A1 * 6/2007 Doblar et al. ............... 711/154

* cited by examiner

*Primary Examiner*—Dang T Nguyen
(74) *Attorney, Agent, or Firm*—Stuart T. Auvinen; g Patent LLC

(57) ABSTRACT

A repairing fully-buffered memory module can have memory chips with some defects such as single-bit errors. A repair controller is added to the Advanced Memory Buffer (AMB) on the memory module. The AMB fully buffers memory requests that are sent as serial packets over southbound lanes from a host. Memory-access addresses are extracted from the serial packets by the AMB. The repair controller compares the memory-access addresses to repair addresses and diverts access from defective memory chips to a spare memory for the repair addresses. The repair addresses can be located during testing of the memory module and programmed into a repair address buffer on the AMB. The repair addresses could be first programmed into a serial-presence-detect electrically-erasable programmable read-only memory (SPD-EEPROM) on the memory module, and then copied to the repair address buffer on the AMB during power-up.

5 Claims, 8 Drawing Sheets

FRONT SIDE

REPAIRING ADVANCED-MEMORY BUFFER (AMB) WITH REDUNDANT MEMORY BUFFER FOR REPAIRING DRAM ON A FULLY-BUFFERED MEMORY-MODULE

RELATED APPLICATION

This is a divisional of U.S. Ser. No. 11/309,297, filed Jul. 24, 2006, now U.S. Pat. No. 7,379,361.

FIELD OF THE INVENTION

This invention relates to memory modules, and more particularly to repairable memory modules.

BACKGROUND OF THE INVENTION

Personal computers (PC's) and other electronic systems often use small printed-circuit board (PCB) daughter cards known as memory modules instead of directly mounting individual memory chips on a motherboard. The memory modules are built to meet specifications set by industry standards, thus ensuring a wide potential market. High-volume production and competition have driven module costs down dramatically, benefiting the PC buyer.

Memory modules are made in many different sizes and capacities, such as older 30-pin and 72-pin single-inline memory modules (SIMMs) and newer 16-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

FIG. 1 shows a fully-buffered memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 is a fully-buffered dual-inline memory module (FB-DIMM) that is fully buffered by Advanced Memory Buffer (AMB) 24 on memory module 10.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

As system clock speeds increase, data must be transmitted and received at ever-increasing rates. Differential signaling techniques are being used to carry data, clock, and commands to and from memory modules. AMB 24 is a chip mounted onto the substrate of memory module 10 to support differential signaling through metal contact pads 12. AMB 24 sends and receives external packets or frames of data and commands to other memory modules in other sockets over differential data lines in metal contact pads 12.

AMB 24 also extracts data from the external frames and writes the extracted data to DRAM chips 22 on memory module 10. Command frames to read data are decoded by AMB 24. AMB 24 sends addresses and read signals to DRAM chips 22 to read the requested data, and packages the data into external frames that are transmitted from AMB 24 over metal contact pads 12 to other memory modules and eventually to the host processor.

Memory module 10 is known as a fully-buffered memory module since AMB 24 buffers data from DRAM chips 22 to metal contact pads 12. DRAM chips 22 do not send and receive data directly from metal contact pads 12 as in many prior memory module standards. Since DRAM chips 22 do not directly communicate data with metal contact pads 12, signals on metal contact pads 12 can operate at very high data rates.

FIG. 2 shows detail of an advanced memory buffer on a fully-buffered memory module. AMB 24 contains DRAM controller 50, which generates DRAM control signals to read and write data to and from DRAM chips 22 on memory module 10. Data is temporarily stored in FIFO 58 during transfers.

The data from FIFO 58 is encapsulated in frames that are sent over differential lines in metal contact pads 12. Rather than being sent directly to the host central processing unit (CPU), the frames are passed from one memory module to the next memory module until the frame reaches the host CPU. Differential data lines in the direction toward the host CPU are known as northbound lanes, while differential data lines from the CPU toward the memory modules are known as southbound lanes.

When a frame is sent from the host CPU toward a memory module, the frame is sent over the southbound lanes toward one of the memory modules in the daisy chain. Each memory module passes the frame along to the next memory module in the daisy chain. Southbound lanes that are input to a memory module are buffered by its AMB 24 using re-timing and re-synchronizing buffers 54. Re-timing and re-synchronizing buffers 54 restore the timing of the differential signals prior to retransmission. Input buffers 52 and output buffers 56 contain differential receivers and transmitters for the southbound lanes that are buffered by re-timing and re-synchronizing buffers 54.

Frames that are destined for the current memory module are copied into FIFO 58 and processed by AMB 24. For example, for a write frame, the data from FIFO 58 is written to DRAM chips 22 on the memory module by AMB 24. For a read, the data read from DRAM chips 22 is stored in FIFO 58. AMB 24 forms a frame and sends the frame to northbound re-timing and re-synchronizing buffers 64 and out over the northbound lanes from differential output buffer 62. Input buffers 66 and output buffers 62 contain differential receivers and transmitters for the northbound lanes that are buffered by re-timing and re-synchronizing buffers 64.

Self-testing of the memory module is supported by built-in self-test (BIST) controller 60. BIST controller 60 may support a variety of self-test features such as a mode to test DRAM chips 22 on the module and a loop-back test mode to test connections through metal contact pads 12 on memory module 10.

FIG. 3 shows fully-buffered memory modules daisy chained together. Host CPU 210 on motherboard 28 reads and writes main memory in DRAM chips 22 on memory modules 201-204 through memory controller 220 on motherboard 28. Memory modules 201-204 are inserted into memory module sockets on motherboard 28.

Rather than read and write DRAM chips 22 directly, host CPU 210 sends read and write commands in packets or frames that are sent over southbound lanes 102. The frame from host CPU 210 is first sent from memory controller 220 to first memory module 201 in the first socket. AMB 24 on first memory module 201 examines the frame to see if it is intended for first memory module 201 and re-buffers and passes the frame on to second memory module 202 over another segment of southbound lanes 102. AMB 24 on second memory module 202 examines the frame and passes the frame on to third memory module 203. AMB 24 on third memory module 203 examines the frame and passes the frame on to fourth memory module 204.

When data is read, or a reply frame is sent back to host CPU 210, northbound lanes 104 are used. For example, when DRAM chips 22 on third memory module 203 are read, the read data is packaged in a frame by AMB 24 and sent over northbound lanes 104 to second memory module 202, which re-buffers the frame and sends it over another segment of northbound lanes 104 to first memory module 201. First memory module 201 then re-buffers the frame of data and sends it over northbound lanes 104 to memory controller 220 and on to host CPU 210.

Since northbound lanes 104 and southbound lanes 102 are composed of many point-to-point links between adjacent memory modules, the length and loading of these segments is reduced, allowing for higher speed signaling. Signaling is to AMB 24 on each memory module rather than to DRAM chips 22.

Many manufacturers make memory modules, including fully-buffered memory modules. Intense competition has driven memory-module prices to low levels, and manufacturers face small profit margins.

Although manufacturing yields are relatively high, some defects do occur. Memory chips may be pre-screened to eliminate any chips with failures before being soldered to the memory module. However, this pre-screening of the memory chips may be scaled back to reduce costs. With limited pre-screening, some memory chips with defects may be soldered to memory modules. The defect in the memory chip may remain undetected until final testing of the finished memory module. Then the module may need to be reworked by un-soldering the defective memory chip, and soldering another memory chip onto the memory module. However, such re-work is expensive and time-consuming.

A limited pre-screening may detect significant multi-bit errors yet not detect some single-bit errors. For example, limited pre-screening test patterns may include checkerboard and reverse checkerboard, not walking ones and zeros and other more complex test patterns than can detect all single-bit errors. Memory chips with single-bit errors may thus be soldered to memory modules when reduced pre-screening of memory chips is performed, rather than more extensive pre-screening. Infant mortalities may also cause memory chips to pass the initial screen yet later fail.

What is desired is the ability to repair memory modules without expensive re-work involving de-soldering a defective memory chip and soldering on a new chip. Reducing manufacturing cost by using a reduced pre-screen test of memory chips is desirable. Repairing memory modules with single-bit errors in one of the memory chips is desirable.

DETAILED DESCRIPTION

The present invention relates to an improvement in memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a spare memory may be integrated with the Advanced Memory Buffer (AMB) of a fully-buffered memory module. This spare memory on the AMB may be accessed rather than a defective memory location on a memory chip. The AMB can compare incoming addresses to a list or map of defective addresses, and re-route the memory access to the spare memory when a hit occurs.

The spare memory on the AMB allows the memory chips mounted onto the fully-buffered memory module to contain a few defects. Manufacturing costs may be reduced since a limited pre-screen test of incoming memory chips may be performed, rather than a more exhaustive pre-screen test. Memory modules with a single-bit defect in one of its memory chips do not have to be reworked, eliminating the time-consuming de-soldering and soldering of the defective memory chip.

Figure 3:
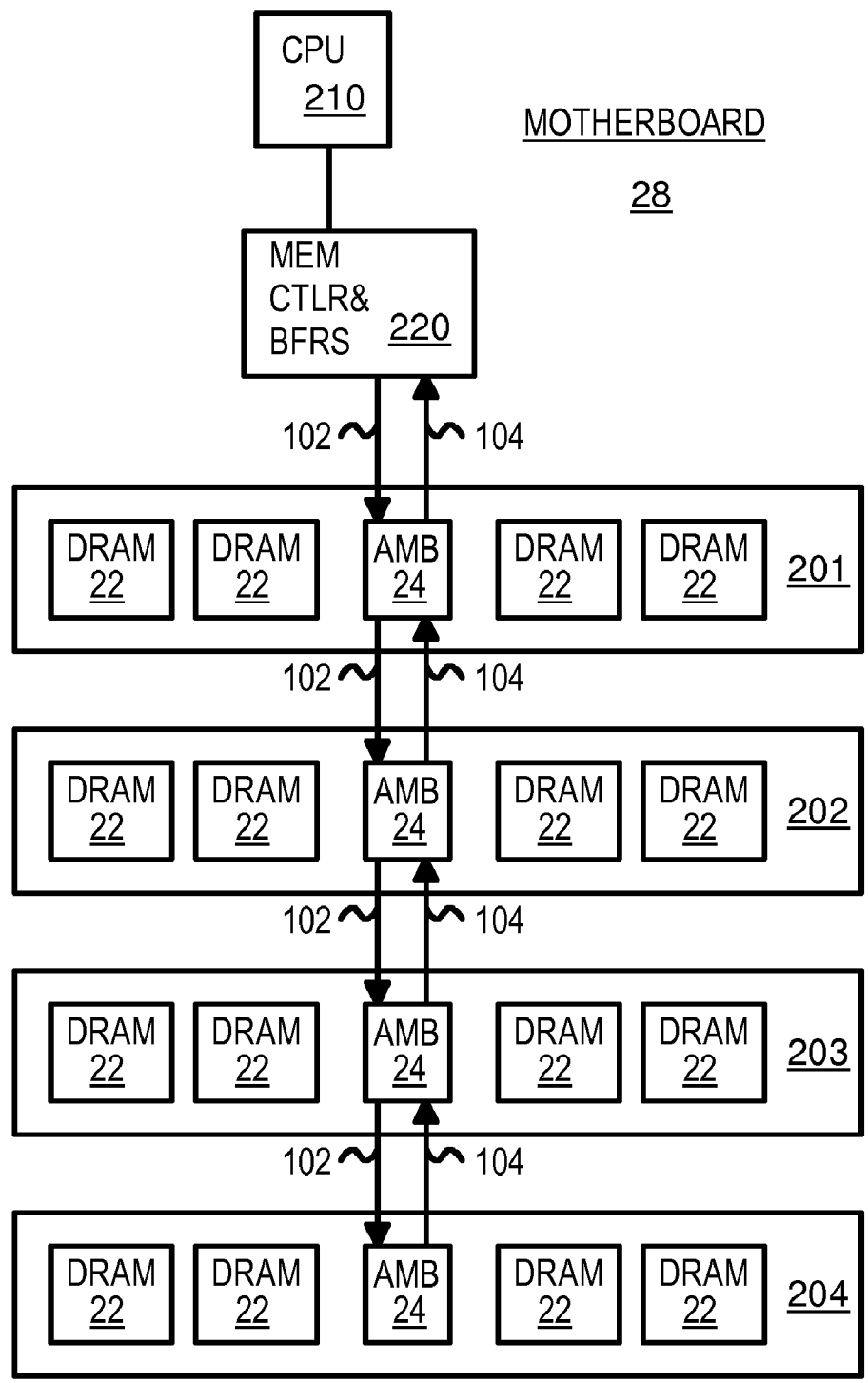
FIG. 3 shows fully-buffered memory modules daisy chained together.
Figure 4:
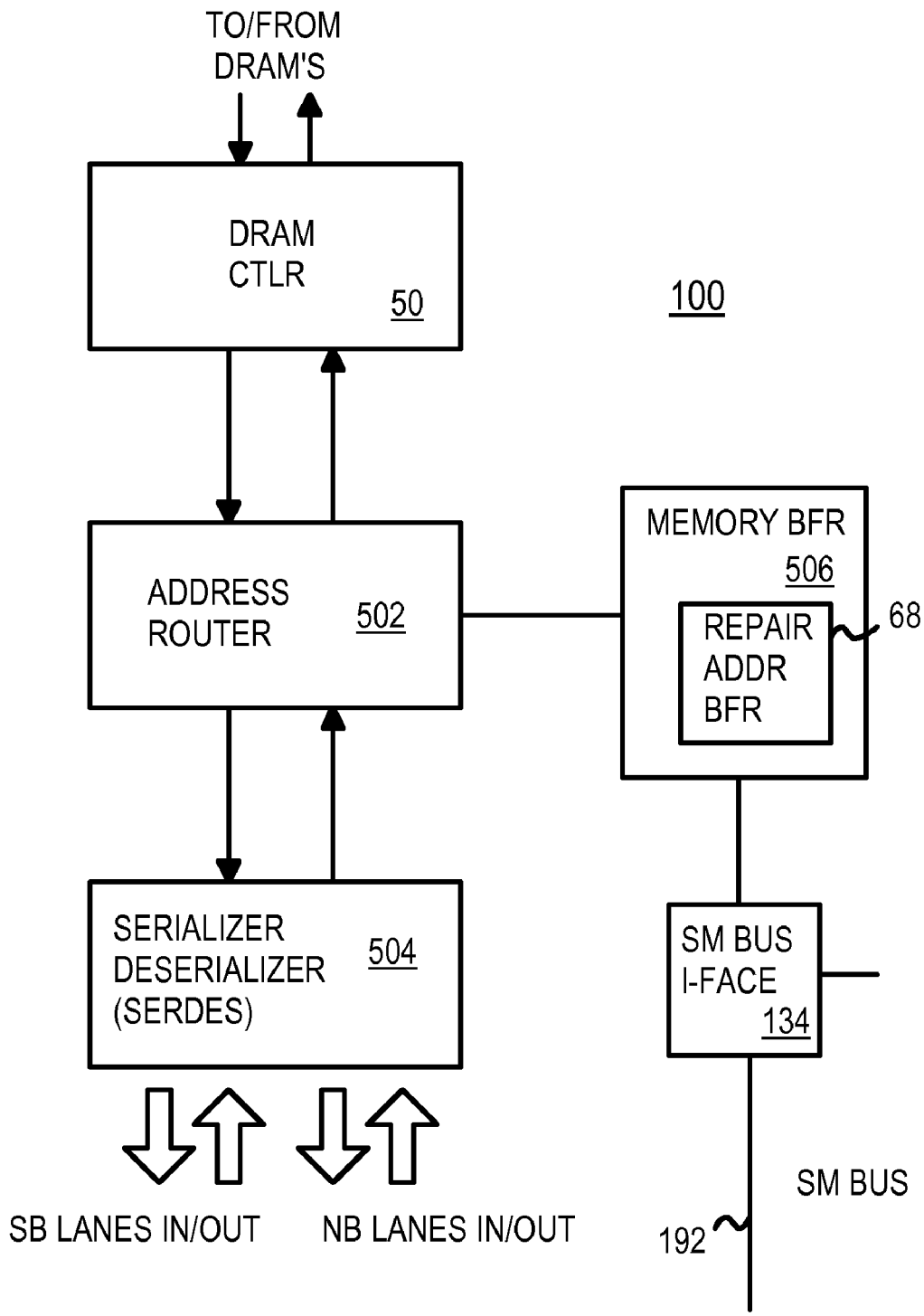
FIG. 4 shows some functional blocks inside a repairing AMB for a repairable fully-buffered memory module.

FIG. 4 shows some functional blocks inside a repairing AMB for a repairable fully-buffered memory module. Repairing AMB 100 replaces the standard AMB on memory module 10 of FIG. 1, or memory modules 201-204 of FIG. 3. No other changes are necessary for the memory modules in this embodiment. Thus repair can be supported with a simple replacement of AMB 24 with repairing AMB 100.

Serial packets are received and retransmitted over southbound lanes for packets generated by the host. Serial packets are received and retransmitted over northbound lanes for packets generated by the memory modules. Serializer-deserializer 504 is an interface to the northbound and southbound lanes, and can examine serial packets and extract address, data, and commands from the packets. Serializer-deserializer 504 can also create serial packets for transmission back to the host, such as packets containing data read from local memory chips.

When serializer-deserializer 504 determines that an incoming packet is destined for the local memory module, the information in the packet is extracted and any address or data is converted from serial to a parallel format. The extracted address is sent to address router 502, which examines the address to determine if the address is for a defective memory location. When the address is not to a defective location, address router 502 passes the address and the request to DRAM controller 50.

DRAM controller 50 generates local control signals such as RAS, CAS, WE and sends these signals to DRAM chips on the memory module. State machines may be used by DRAM controller 50 to generate these signals with appropriate pulse widths and timings to properly access the DRAM chips. Chip-select and byte-enable signals to the DRAM chips may be generated from the address as well as from these control signals. Data is applied to the DRAM chips for a write, or read from the DRAM chips being accessed for a read. The read data is then passed back to serializer-deserializer 504, converted to serial packets and transmitted back to the host over the northbound lanes.

Sometimes the address being accessed is for a defective location. The memory chip is unreliable for that defective address location. Rather than access the defective location in the memory chip, a spare memory is accessed. For addresses matching defective addresses, address router 502 sends the request to memory buffer 506 rather than to DRAM controller 50. DRAM controller 50 is effectively disabled for these defective memory locations.

Memory buffer 506 contains spare memory that may be accessed rather than defective memory in the defective memory chip. Data that is to be written to the defective memory chip is instead written to a memory location within memory buffer 506. When the defective memory location is read, the read data is read from a location in memory buffer 506 rather than from the defective memory chip.

Memory buffer 506 may contain just one memory location, allowing only one defect to be repaired in the entire memory module. Alternately, memory buffer 506 may contain several locations, allowing several different defects to be repaired. Two or more memory chips could be defective, or there could be two defects in one chip. Each spare memory location in memory buffer 506 could be a byte or larger word that replaces an entire byte or word in the defective memory chip, even when only one bit is defective. A larger block could also be replaced with the spare memory.

Repair address buffer 68 contains a list of one or more defective memory locations. The entire address of the defective location could be stored in repair address buffer 68, or just a portion of the defective address. The address could be divided into tag and index portions when repair address buffer 68 is arranged as a cache, or repair address buffer 68 could be a fully-associative buffer.

Address router 502 compares addresses of requests from serializer-deserializer 504 to repair addresses in repair address buffer 68 to determine when the request is to a defective memory location. The address lookup could delay processing of the request, or pipelining may be able to reduce or eliminate this lookup delay. When repair address buffer 68 contains few entries, the lookup may be very short. DRAM controller 50 could be activated for all requests, and then de-activated when a defective address hit is detected by address router 502 in repair address buffer 68.

The defective address locations stored in repair address buffer 68 may be programmed or written through SM-bus interface 134. SM-bus interface 134 receives serial commands from SM bus 192, which is a system management bus. Repair address buffer 68 may be a volatile memory such as a register, static RAM, or dynamic RAM, and have to be loaded at each power-up. Alternately, repair address buffer 68 could be a non-volatile memory such as electrically-erasable programmable read-only memory (EEPROM) or fuses that could be blown.

Figure 5:
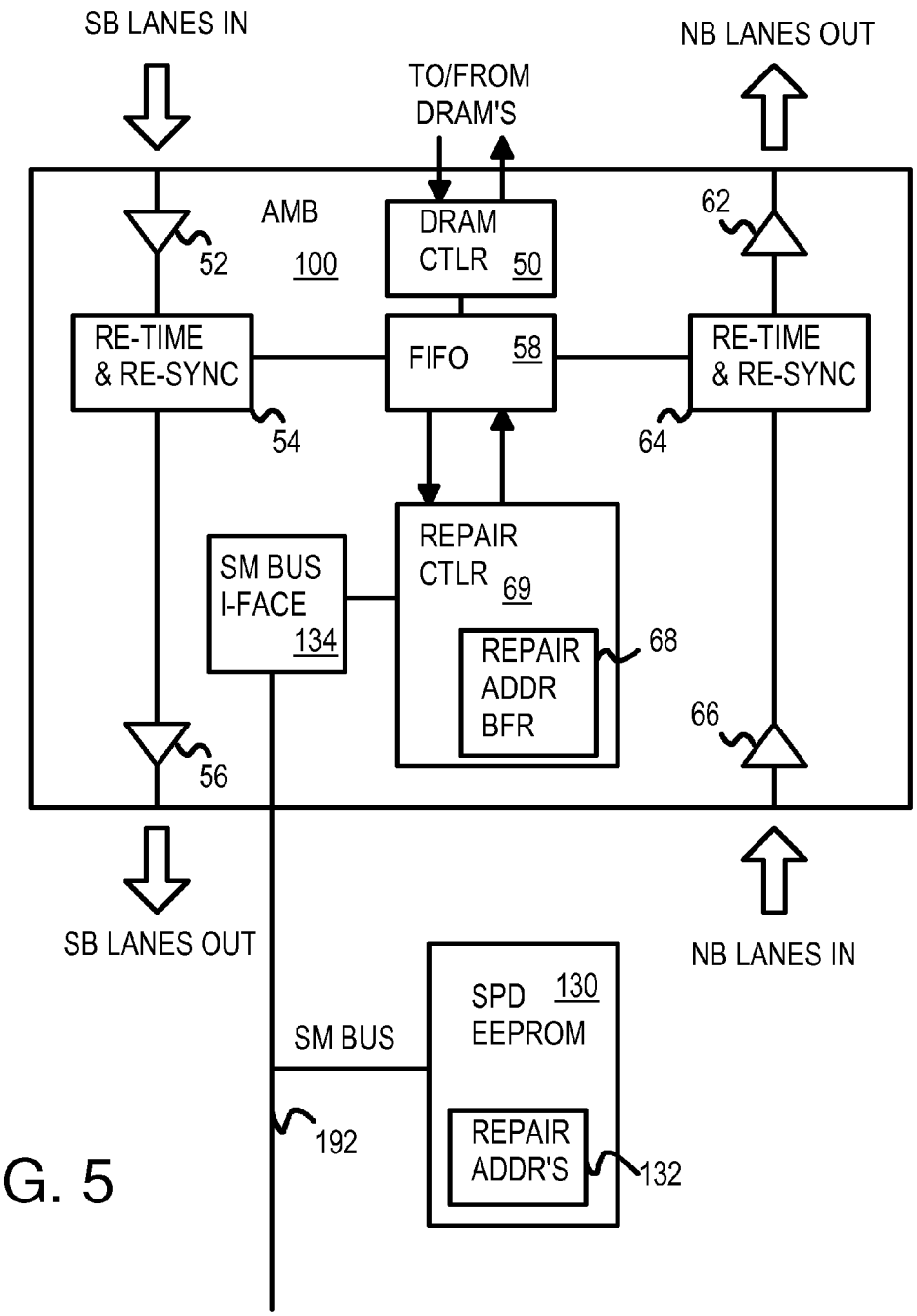
FIG. 5 shows a repairing AMB that has defective addresses programmed from a serial-presence-detect electrically-erasable programmable read-only memory (SPD-EEPROM) on the memory module.

FIG. 5 shows a repairing AMB that has defective addresses programmed from a serial-presence-detect electrically-erasable programmable read-only memory (SPD-EEPROM) on the memory module. Many memory modules contain SPD-EEPROM 130. SPD-EEPROM 130 stores configuration information for the memory module, such as speed, depth, and arrangement of the memory on the memory module. During initialization, the host processor reads the configuration from SPD-EEPROM 130 over SM bus 192 as serial data.

SPD-EEPROM 130 also stores locations of defective memory on the memory module. During manufacture, defective locations are identified and their addresses are written as repair addresses 132 in SPD-EEPROM 130. Each time that the memory module is powered up or re-initialized, repair addresses 132 are transferred to repair address buffer 68. SM-bus interface 134 reads repair addresses 132 from SPD-EEPROM 130 over SM bus 192.

Repair controller 69 compares addresses of requests to the repair addresses stored in repair address buffer 68 to determine when a repair hit occurs. For repair-address hits, spare memory is accessed by repair controller 69 rather than the defective memory in the DRAM chips through DRAM controller 50. The spare memory may be within repair controller 69 or may be attached to repair address buffer 68.

Figure 1:
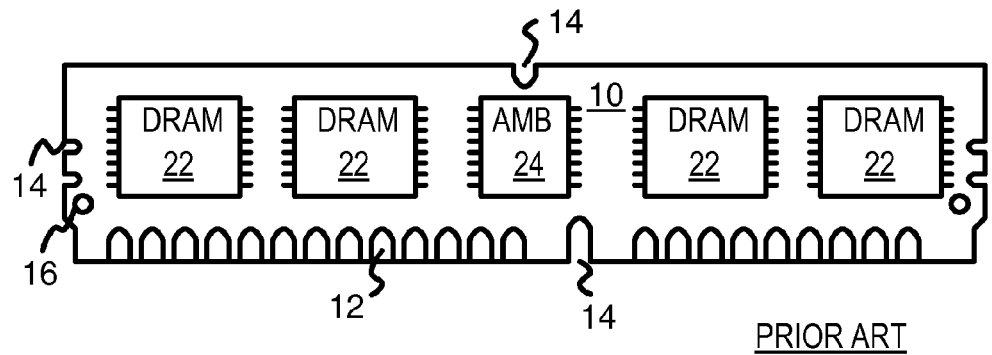
FIG. 1 shows a fully-buffered memory module.
Figure 2:
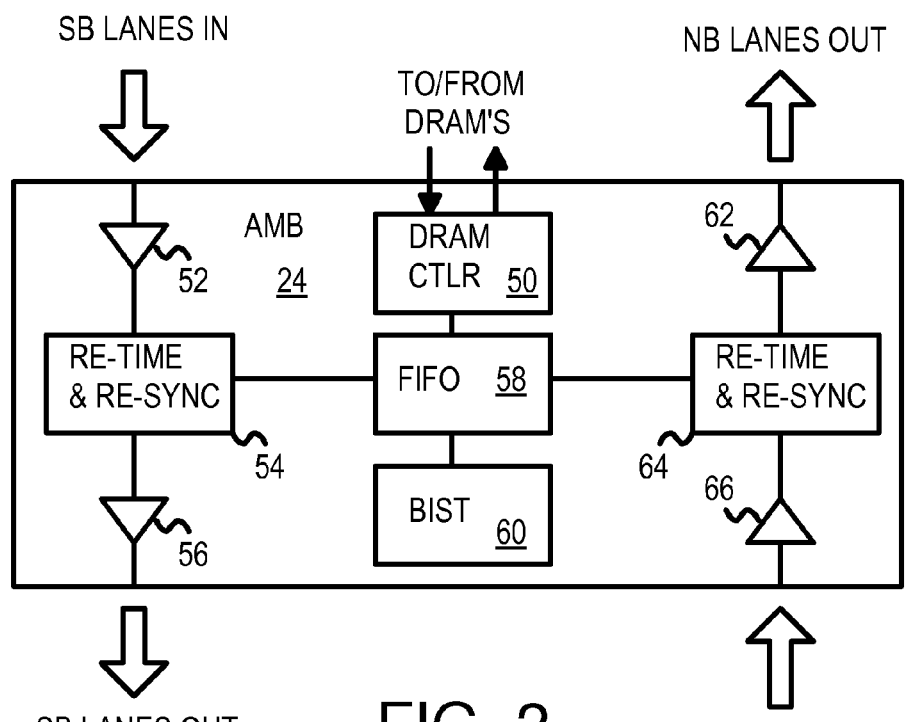
FIG. 2 shows detail of an advanced memory buffer on a fully-buffered memory module.

Repairing AMB 100 contains DRAM controller 50. For non-repair addresses, DRAM controller 50 generates DRAM control signals to read and write data to and from DRAM chips 22 on memory module 10 (FIG. 1). Data is temporarily stored in FIFO 58 during transfers. The data from FIFO 58 is encapsulated in frames that are sent over differential lines in metal contact pads 12. Re-timing and re-synchronizing buffers 54 restore the timing of the differential signals received by input buffers 52 prior to retransmission. Input buffers 52 and output buffers 56 contain differential receivers and transmitters for the southbound lanes that are buffered by re-timing and re-synchronizing buffers 54.

Frames that are destined for the current memory module are copied into FIFO 58 and processed by repairing AMB 100. For example, for a write frame, the data from FIFO 58 is written to DRAM chips 22 on the memory module by repairing AMB 100. For a read, the data read from DRAM chips 22 is stored in FIFO 58. Repairing AMB 100 forms a frame and sends the frame to northbound re-timing and re-synchronizing buffers 64 and out over the northbound lanes from differential output buffer 62. Input buffers 66 and output buffers 64 contain differential receivers and transmitters for the northbound lanes that are buffered by re-timing and re-synchronizing buffers 64.

Figure 6:
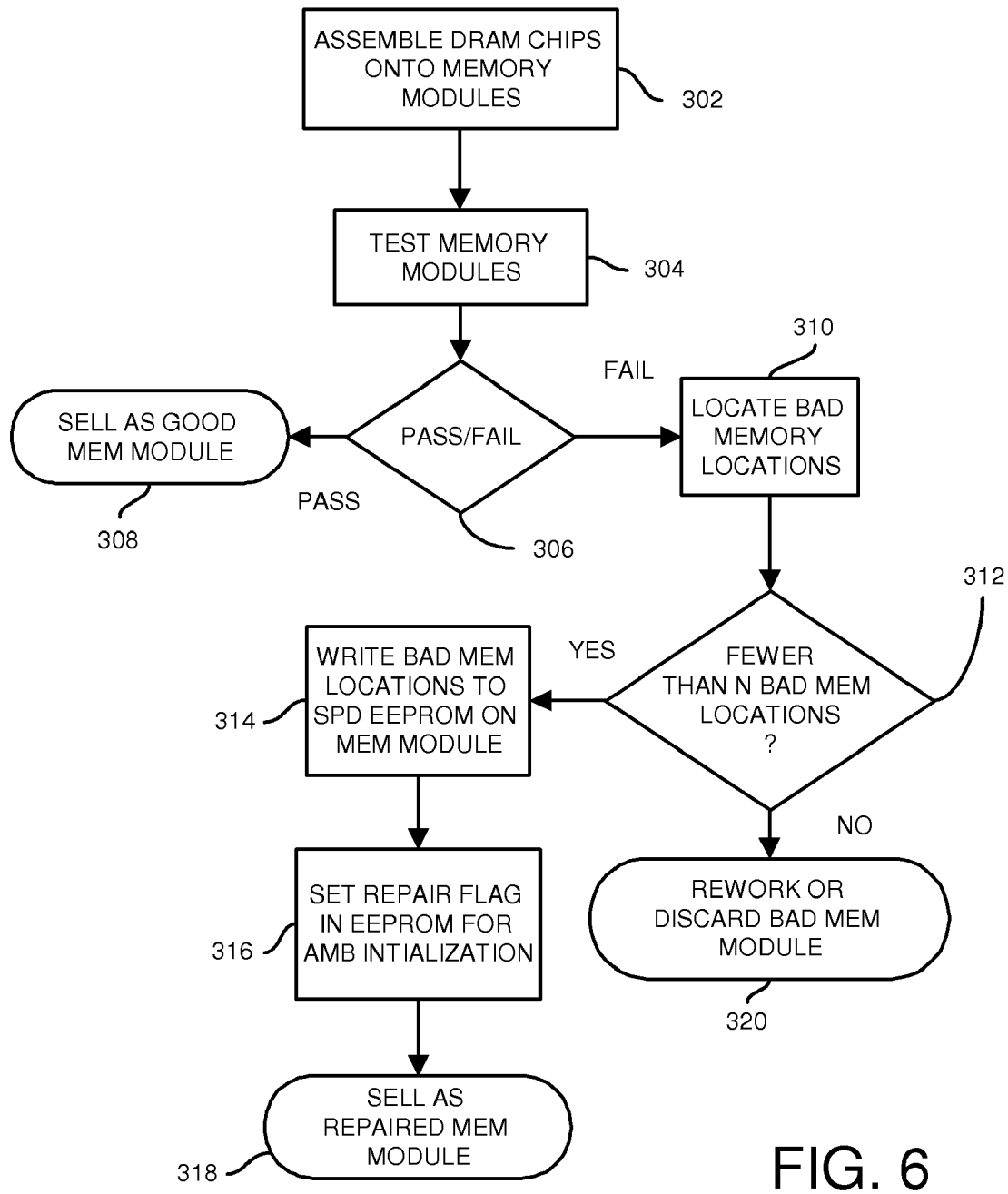
FIG. 6 is a flowchart of manufacturing repairable memory modules.

FIG. 6 is a flowchart of manufacturing repairable memory modules. Memory chips are pre-screened with a reduced set of test patterns that do not detect all single-bit errors. This reduced pre-screen test is less expensive that an exhaustive pre-screen test, so the testing costs may be reduced significantly. For example, each memory chip may require only 100 seconds of testing for a reduced pre-screen test, but 600 seconds for an exhaustive pre-screen test.

Memory chips passing the reduced pre-screen test are assembled onto substrates of memory modules, step 302. A repairing AMB chip is also soldered onto the memory module substrate, and other components such as capacitors may be added. The memory modules are tested, step 304, to detect any defects. When a memory module passes the test at step 304 with no defects, it can be sorted and sold as a good memory module, step 308.

If a defect is found at steps 304, 306, then the module has failed. The locations of the bad memory locations are determined, step 310. This may require further testing, perhaps on a different test machine than the tester for step 304. The number of defects is compared to a limit, step 312. When there are more defects than the limit, the memory module is sorted as a bad module and reworked or discarded, step 320.

When the number of defects is below the limit, step 312, then the locations of the defects are written to SPD-EEPROM 130 on the module as the repair addresses, step 314. Since SPD-EEPROM 130 is non-volatile, these repair addresses are not lost when power is removed from the memory module.

A repair flag may be set in SPD-EEPROM 130, step 316. The repair flag may be read during power-up initialization of the memory module to determine when the repair controller needs to be activated. The repair addresses are then copied to repair address buffer 68 in repairing AMB 100 when the repair flag is in the set state.

The repaired memory modules are sorted and can be sold as repaired memory modules, step 318. Further testing of the repaired memory module may also be performed. Since the repaired memory modules and the good memory modules from step 308 have the same chips, and operate the same from the motherboard's viewpoint, both kinds of memory modules could be sold.

The limit N of allowable defects (step 312) may be set to a low value such as 1, 2, or 8 when few defects are likely. Memory modules with more defects are likely to have serious problems and may be better to be reworked or discarded. Rather than have a numerical limit to the number of defects, the locations of the defects may be considered. For example, a direct-mapped repair address buffer 68 may only allow one defect with a particular index address. Any other defects with the same index address cannot be repaired. Thus while several defects may be allowed, no two defects can map to the same index. Other limitations on defect locations could correspond to shortcuts in decoding made by the repair controller.

Figure 7:
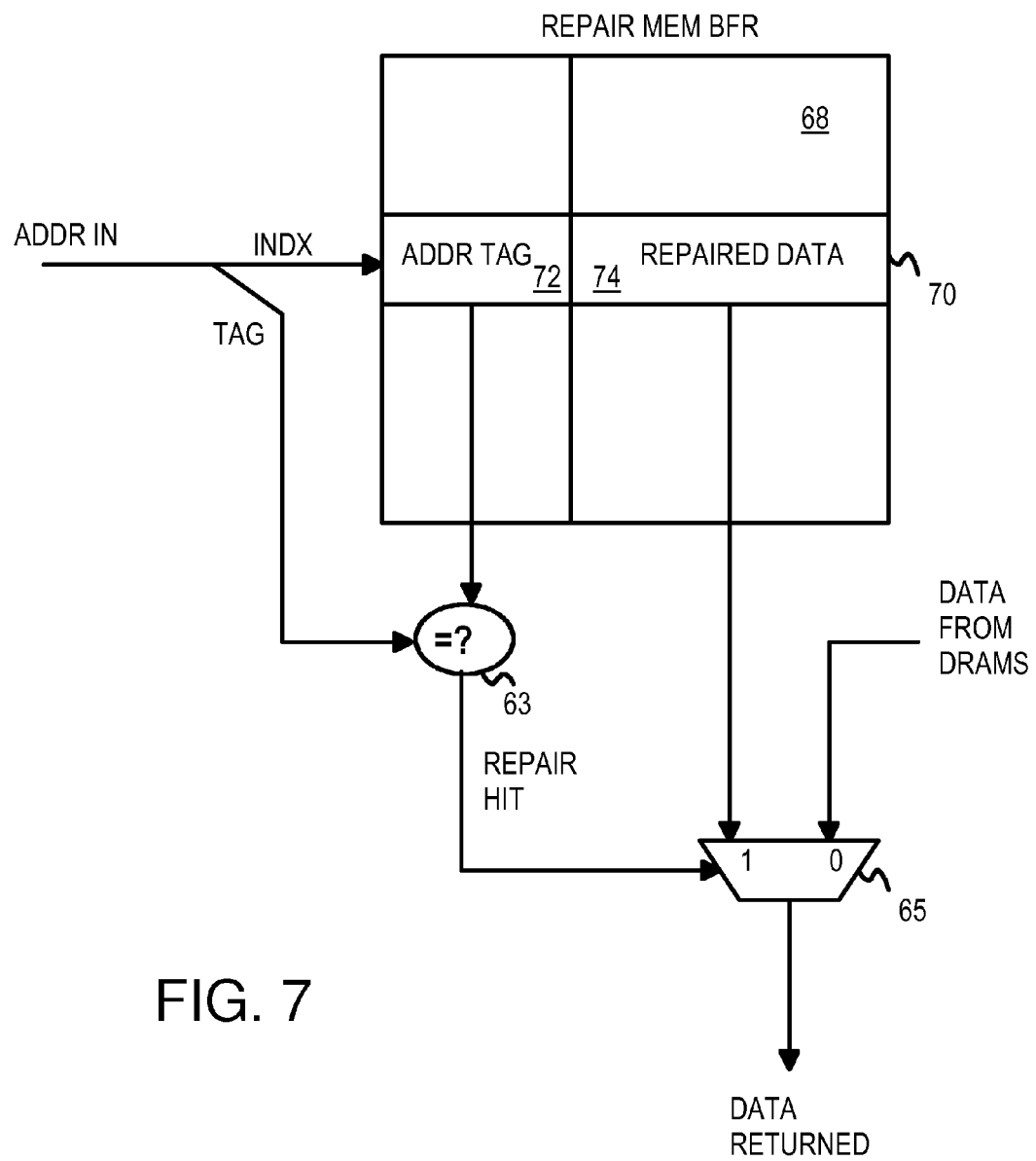
FIG. 7 shows a repair address buffer that stores both the repair address and the repair data.

FIG. 7 shows a repair address buffer that stores both the repair address and the repair data. Repair address buffer 68 can be extended to include repaired data fields 74 in each valid repair-address entry. Then a separate memory buffer 506 (FIG. 4) for the repair data is not needed.

Repair address buffer 68 can be arranged as a cache. The incoming address of a memory request extracted from a serial packet received on the southbound lanes can be split into an index portion and a tag portion. For example, the least-significant-bits (LSBs) can be the index and the most-significant-bits (MSBs) be the tag. The index portion of the address selects one of the entries in repair address buffer 68 as selected entry 70. Address tag 72 stored in selected entry 70 is read out and compared to the tag portion of the incoming address by comparator 63 to determine if a match occurred. A valid bit (not shown) may also be stored with selected entry 70 and used to validate the match.

When comparator 63 finds a valid match, a repair hit is signaled. Mux 65 selects repair data 74 stored with corresponding address tag 72 in selected entry 70, rather than data read from the defective memory chip by DRAM controller 50. When no repair hit occurs, data is transferred from the memory chip by DRAM controller 50.

Repair address buffer 68 could be arranged as a direct-mapped cache with only one entry per index address, or as a set-associative cache with 2, 4, or more entries per index address. If the number of defects is expected to be small, then a direct-mapped cache is acceptable. If two or more defect addresses map to the same index, then the memory module could be re-worked or discarded as an un-repairable module.

Figure 8:
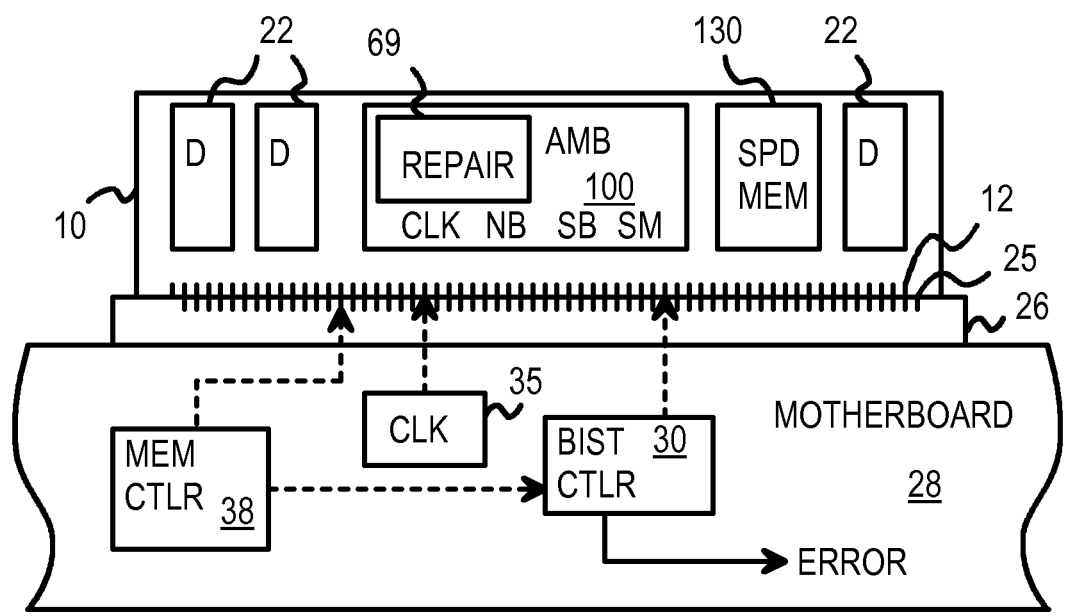
FIG. 8 shows a fully-buffered memory module with a repairing AMB driven by a memory controller on a motherboard.

FIG. 8 shows a fully-buffered memory module with a repairing AMB driven by a memory controller on a motherboard. Memory module 10 is inserted into memory module socket 26, with module contact pads 12 making contact with socket pads 25 in memory module socket 26 on PC motherboard 28.

With memory module 10 inserted into memory module socket 26, memory controller 38 on PC motherboard 28 receives data from a CPU or bus master and generates control signals that pass through memory module socket 26 to memory module 10. Clock generator 35 generates a clock that is also passed through as a clock to repairing AMB 100 on memory module 10.

Repair addresses are stored in SPD-EEPROM 130 during manufacture. These repair addresses are copied to repairing AMB 100 so that repair controller 69 can compare addresses from the southbound lanes to the local copy of the repair addresses. Thus one or more of DRAM chips 22 may have a defective memory location and still be repairable using repair controller 69 in repairing AMB 100.

Memory controller 38 on motherboard 28 does not have to support repair re-mapping. Indeed, memory controller 38 is not aware of repair remapping by repair controller 69, since repair remapping is transparent to motherboard 28.

BIST controller 30 on motherboard 28 activates test modes of repairing AMB 100 using the SM bus. Errors detected by the internal BIST circuitry in repairing AMB 100 can be passed through to BIST controller 30 to signal an error to an operating system or boot routine running on motherboard 28.

Figure 9:
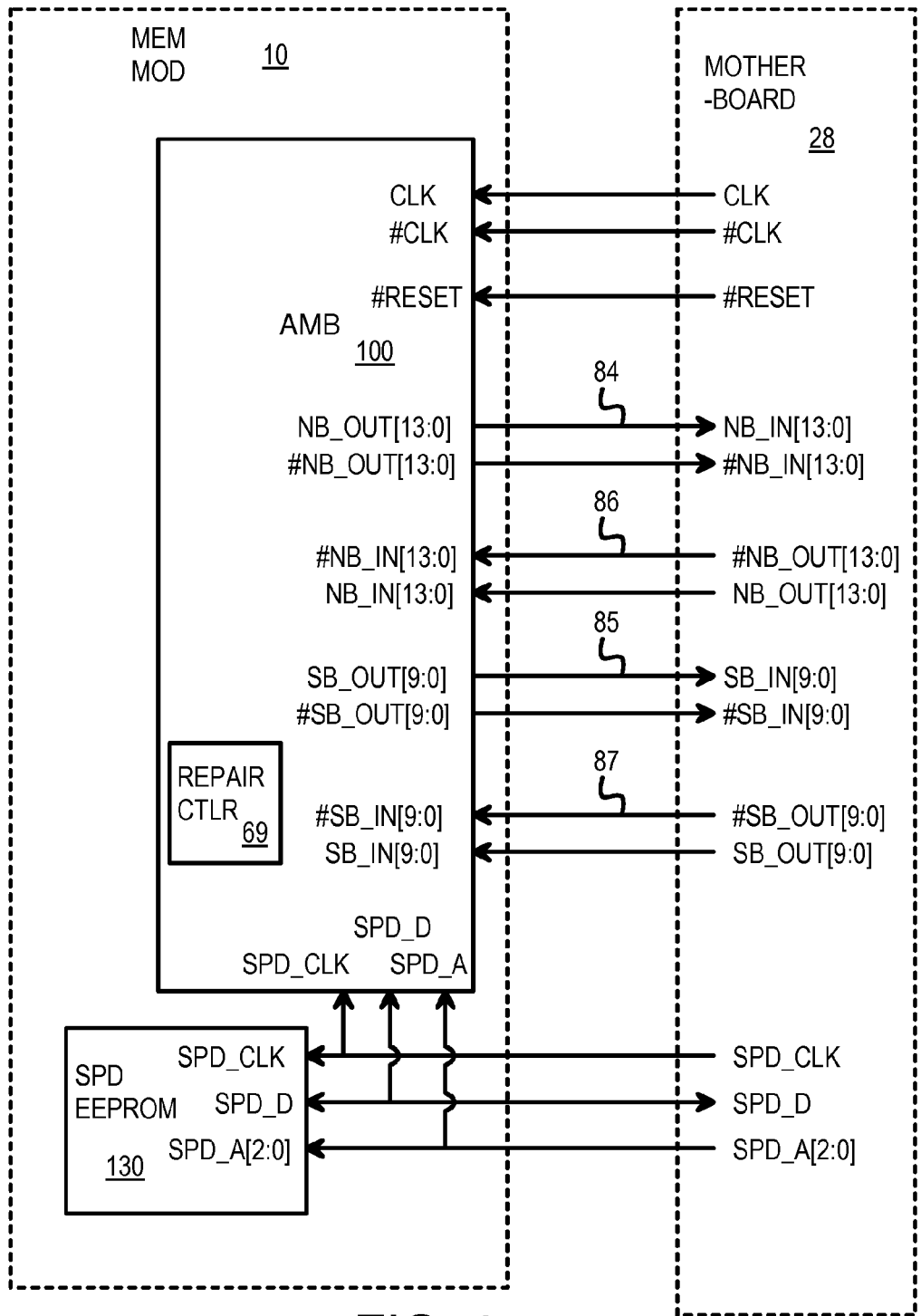
FIG. 9 is a diagram showing northbound and southbound lanes and SM bus signals between a memory module and a motherboard.

FIG. 9 is a diagram showing northbound and southbound lanes and SM bus signals between a memory module and a motherboard. Memory module 10 is a fully-buffered memory module that contains DRAM chips (not shown) that are buffered by repairing AMB 100. Motherboard 28 contains a processor and other logic that generates control signals such as a differential clock, a reset signal, a system management bus or other control signals applied to SPD-EEPROM 130.

SPD EEPROM 130 stores configuration and repair-address information about memory module 10 that is sent over serial data line SPD_D synchronized to SPD clock SPD_CLK. Address inputs to SPD EEPROM 130 are carried from motherboard 28 on address lines SPD_A[2:0], which may be hard wired on motherboard 28. The wiring configuration of SPD_A[2:0] on motherboard 28 determines the device address (memory-module slot number) of memory module 10. Data sent over serial data line SPD_D is a series of frames consisting of device address, device type (repairing AMB 100 or SPD EEPROM 130), register location, and register data. Test mode is activated on repairing AMB 100 by writing to the AMB test-mode control registers. Repairing AMB 100 and SPD EEPROM 130 can share clock, address, and serial data lines, but respond to different device types at the same device address.

Repair controller 69 is within repairing AMB 100. Repair addresses stored in SPD-EEPROM 130 can be copied to a repair address buffer in repairing AMB 100 as serial data sent over serial data line SPD_D synchronized to serial clock SPD_CLK. SM-bus interface 134 in repairing AMB 100 can drive the device address of SPD-EEPROM 130 onto serial address lines SPD_A[2:0] to read SPD-EEPROM 130 over serial data lines SPD_D. SM-bus interface 134 on repairing AMB 100 could generate the serial clock, or a free-running serial clock generated on motherboard 28 could be used.

Northbound lane inputs NB_IN[13:0], #NB_IN[13:0] to repairing AMB 100 are connected to northbound lane motherboard outputs 86, NB_OUT[13:0], #NB_OUT[13:0] on motherboard 28. These 14 northbound lanes carry frames generated by downstream memory modules that are being sent to the processor, perhaps through upstream memory modules (not shown).

Northbound lane outputs NB_OUT[13:0], #NB_OUT[13:0] from repairing AMB 100 are connected to northbound lane motherboard inputs 84 (NB_IN[13:0], #NB_IN[13:0]) on motherboard 28. These 14 northbound lanes carry frames generated by memory module 10 or generated by downstream memory modules that are being sent to the processor. Northbound lane inputs NB_IN[13:0], #NB_IN[13:0] on motherboard 28 could connect to the memory controller and to the processor directly, or could connect to an upstream memory module (not shown).

Southbound lane inputs SB_IN[9:0], #SB_IN[9:0] to repairing AMB 100 are connected to southbound lane motherboard outputs 87, SB_OUT[9:0], #SB_OUT[9:0] on motherboard 28. These 10 southbound lanes carry frames generated by the processor that are being sent to memory module 10 or to downstream memory modules in the daisy chain.

Southbound lane outputs SB_OUT[9:0], #SB_OUT[9:0] from repairing AMB 100 are connected to southbound lane motherboard inputs 85 (SB_IN[9:0], #SB_IN[9:0]) on motherboard 28. These 10 southbound lanes carry frames generated by the processor that are being sent to downstream memory modules. Southbound lane outputs SB_OUT[9:0], #SB_OUT[9:0] on motherboard 28 could be driven by the memory controller directly, or could connect to an upstream memory module (not shown).

ALTERNATE EMBODIMENTS

Several other embodiments are contemplated by the inventors. For example the various functions may be partitioned into a variety of kinds and numbers of blocks. Functions may be implements in hardware, software, firmware, or various combinations. For example, basic functions such as address comparisons may be implemented in hardware logic gates, while more complex functions such as error handling may be assisted by execution of program instructions.

SPD-EEPROM 130 could be integrated into repairing AMB 100. Memory buffer 506 could be a memory external to repairing AMB 100 rather than be integrated with repairing AMB 100. Repair address buffer 68 could be non-volatile memory on repairing AMB 100 and could be directly programmed once, eliminating the need to transfer repair addresses from SPD-EEPROM 130 at each initialization. Memory buffer 506 could be an extension of repair address buffer 68, or could be part of a larger on-chip memory that includes FIFO 58.

Memory for the repair address in repair address buffer 68 may be flip-flops, registers, latches, SRAM, DRAM, non-volatile memory, or other kinds of memory. Likewise, spare repair memory that stores the replacement data may be flip-flops, registers, latches, SRAM, DRAM, non-volatile memory, or other kinds of memory. The repair addresses and/or the repair data may be internal to repairing AMB 100 or may be external to repairing AMB 100.

BIST controller 30 could be BIOS codes that are tightly linked to the operating system. It could also be an application program which is run during system maintenance. Other arrangements of repair address buffer 68 may be used, such as a linked list, a tree lookup structure, or a simple list of repair addresses. A few bits of the address could be compared, and if a match occurred, then more bits are compared, and delay time added. Many optimizations are possible.

The number of northbound and southbound lanes may vary. Different control signals may be used. Traces may be formed from metal traces on surfaces of the memory module, or on interior traces on interior layers of a multi-layer PCB. Vias, wire jumpers, or other connections may form part of the electrical path. Resistors, capacitors, or more complex filters and other components could be added. For example, power-to-ground bypass capacitors could be added to the memory module.

Signals may be half swing with source termination (output buffer) and load termination (input buffer). A series resistor or a shunt resistor in the path attenuates the signal. Shunt resistance may be around 500 ohms with a line impedance of 50 ohms.

Muxes and switches could be added to allow for loop-back testing as well as standard operation. Future memory module standards and extensions of the fully-buffered DIMM standard could benefit from the invention.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A repairing advanced memory buffer comprising:
southbound input means for receiving packets over southbound serial lanes from a host processor;
southbound output means for transmitting packets over southbound serial lanes to a downstream memory module;
southbound re-timer means, coupled between the southbound input means and the southbound output means, for re-timing packets received by the southbound input means for transmission over the southbound output means;
northbound input means for receiving packets over northbound serial lanes from the downstream memory module;
northbound output means for transmitting packets over northbound serial lanes toward the host processor;
northbound re-timer means, coupled between the northbound input means and the northbound output means, for re-timing packets received by the northbound input means for transmission over the northbound output means;

memory controller means for generating local control signals to memory chips on a local memory module containing the repairing advanced memory buffer;

packet extract means, coupled between the southbound re-timer means and the memory controller means, for extracting commands, address and data from packets received over the southbound input means from the host processor;

packet generation means, coupled between the northbound re-timer means and the memory controller means, for generating packets for transmission over the northbound output means to the host processor;

wherein the packets generated by the packet generation means contain data read from the memory chips by the memory controller means for address locations within the memory chips that are not defective address locations;

repair address buffer means for storing repair addresses, the repair addresses identifying address locations within the memory chips that are defective address locations; and repair controller means, coupled to the repair address buffer means and to the memory controller means, for disabling access of the memory chips by the memory controller means for repair addresses, whereby access of memory chips is disabled for repair addresses.

2. The repairing advanced memory buffer of claim 1 further comprising:

spare memory means, accessed by the repair controller means for repair addresses, for storing replacement data for address locations within the memory chips that are defective address locations;

wherein the packets generated by the packet generation means contain the replacement data read from the spare memory means for address locations within the memory chips that are defective address locations, whereby access is diverted to the spare memory means for repair addresses.

3. The repairing advanced memory buffer of claim 2 further comprising:

management-bus interface means for reading the repair addresses from a non-volatile memory over a management bus and for writing the repair addresses to the repair address buffer means, whereby the repair addresses are copied from the non-volatile memory to the repair address buffer means.

4. The repairing advanced memory buffer of claim 2 wherein the repair address buffer means further comprises the spare memory means, whereby the repair address buffer means stores the repair addresses and the replacement data.

5. The repairing advanced memory buffer of claim 2 further comprising;

address router means, coupled to the packet extract means, for comparing an extracted address extracted from the packets received over the southbound input means from the host processor to the repair addresses.

* * * * *